(12) United States Patent
Turner et al.

(10) Patent No.: US 9,564,542 B2
(45) Date of Patent: Feb. 7, 2017

(54) SELECTIVE TRANSFORMATION IN FUNCTIONAL FILMS, AND SOLAR CELL APPLICATIONS THEREOF

(75) Inventors: Adrian Bruce Turner, Palo Alto, CA (US); Oliver Schultz-Wittmann, Sunnyvale, CA (US); Denis De Ceuster, Woodside, CA (US); Douglas E. Crafts, Los Gatos, CA (US)

(73) Assignee: TETRASUN, INC., San Jose, CA (US)

( * ) Notice: Subject to any disclaimer, the term of this patent is extended or adjusted under 35 U.S.C. 154(b) by 496 days.

(21) Appl. No.: 13/496,555

(22) PCT Filed: Sep. 17, 2010

(86) PCT No.: PCT/US2010/049221
§ 371 (c)(1),
(2), (4) Date: Apr. 3, 2012

(87) PCT Pub. No.: WO2011/035090
PCT Pub. Date: Mar. 24, 2011

(65) Prior Publication Data
US 2012/0186649 A1    Jul. 26, 2012

Related U.S. Application Data

(60) Provisional application No. 61/243,211, filed on Sep. 17, 2009.

(51) Int. Cl.
| | |
|---|---|
| *H01L 31/18* | (2006.01) |
| *H01L 31/0216* | (2014.01) |
| *H01L 31/0224* | (2006.01) |

(52) U.S. Cl.
CPC . *H01L 31/022425* (2013.01); *H01L 31/02168* (2013.01); *H01L 31/1864* (2013.01);
(Continued)

(58) Field of Classification Search
CPC .................. H01L 31/022425; H01L 31/02168; H01L 31/1864; H01L 31/1868
(Continued)

(56) References Cited

U.S. PATENT DOCUMENTS

| | | | | |
|---|---|---|---|---|
| 4,090,213 A | * | 5/1978 | Maserjian et al. | ............ 136/255 |
| 4,278,704 A | * | 7/1981 | Williams | ........................ 438/98 |

(Continued)

FOREIGN PATENT DOCUMENTS

WO    2009051595 A1    4/2009

OTHER PUBLICATIONS

Taft, E. A. "Index of Refraction of Steam Grown Oxides on Silicon." Journal of the Electrochemical Society 127.4 (1980): 993-94.*

(Continued)

*Primary Examiner* — Keith Hendricks
*Assistant Examiner* — Kourtney S Carlson
(74) *Attorney, Agent, or Firm* — Kevin P. Radigan, Esq.; Heslin Rothenberg Farley & Mesiti P.C.

(57) ABSTRACT

A solar cell formation method, and resulting structure, having a first film and a barrier film over a surface of a doped semiconductor, wherein the optical and/or electrical properties of the first film are transformed in-situ such that a resulting transformed film is better suited to the efficient functioning of the solar cell; wherein portions of the barrier film partially cover the first film and substantially prevent transformation of first film areas beneath the portions of the barrier film.

22 Claims, 7 Drawing Sheets

PLATING

(52) U.S. Cl.
CPC .......... *H01L 31/1868* (2013.01); *Y02E 10/50* (2013.01); *Y02P 70/521* (2015.11)

(58) Field of Classification Search
USPC ................... 136/241–265; 438/72, 85, 82
See application file for complete search history.

(56) References Cited

U.S. PATENT DOCUMENTS

| | | | | |
|---|---|---|---|---|
| 5,804,482 | A | * | 9/1998 | Konstantinov ........... C23C 8/02 257/E21.056 |
| 2002/0001746 | A1 | | 1/2002 | Jenson |
| 2002/0044331 | A1 | | 4/2002 | Agrawal et al. |
| 2003/0087107 | A1 | | 5/2003 | Varaprasad et al. |
| 2008/0000521 | A1 | * | 1/2008 | Sivoththaman et al. ..... 136/254 |
| 2008/0216893 | A1 | * | 9/2008 | Russell et al. ................ 136/261 |
| 2008/0245415 | A1 | * | 10/2008 | Kim et al. .................... 136/261 |
| 2009/0056800 | A1 | * | 3/2009 | Ulyashin et al. ............. 136/256 |
| 2009/0095346 | A1 | * | 4/2009 | Hurley et al. ................ 136/256 |
| 2009/0165855 | A1 | * | 7/2009 | Sun et al. ..................... 136/261 |
| 2009/0194154 | A1 | * | 8/2009 | Takahashi et al. ........... 136/255 |
| 2010/0052137 | A1 | * | 3/2010 | Meyer et al. ................. 257/687 |
| 2010/0258168 | A1 | * | 10/2010 | Yu et al. ....................... 136/255 |

OTHER PUBLICATIONS

"Silicon." Silicon. Precision Micro-Optics, date unknown, accessed: Oct. 31, 2014.<http://www.pmoptics.com/silicon.html>.*
"NSM Archive—Silicon Carbide (SiC)—Optical Properties." NSM Archive—Silicon Carbide (SiC)—Optical Properties. Ioffe Institute, Dec. 29, 2015. <http://www.ioffe.ru/SVA/NSM/Semicond/SiC/optic.html>.*
Luthra, Krishan L. "Some New Perspectives on Oxidation of Silicon Carbide and Silicon Nitride." Jounal of the American Ceramic Society J American Ceramic Society 74.5 (1991): 1095-103.*
International Search Report and Written Opinion for PCT/US2010/049221 dated Nov. 10, 2010.

* cited by examiner

PRE-OXIDATION STRUCTURE

POST-OXIDATION STRUCTURE

PLATING

PRE-OXIDATION STRUCTURE

POST-OXIDATION STRUCTURE

PLATING

PRE-OXIDATION STRUCTURE

POST-OXIDATION STRUCTURE

PLATING

PRE-OXIDATION STRUCTURE

POST-OXIDATION STRUCTURE

METAL DEPOSITION

METAL DEPOSITION

POST-OXIDATION STRUCTURE

PLATING

SELECTIVE TRANSFORMATION IN FUNCTIONAL FILMS, AND SOLAR CELL APPLICATIONS THEREOF

RELATED APPLICATION INFORMATION

This Application is a National Stage filing under section 371 of International Application No. PCT/US2010/049221, filed 17 Sept. 2010, and this Application is related to commonly-assigned, previously filed U.S. Provisional Application entitled "High-Efficiency Solar Cell Structures and Methods of Manufacture," filed 21 Apr. 2009 and assigned application No. 61/171,194; and to commonly-assigned, International Patent Application entitled "High-Efficiency Solar Cell Structures and Methods of Manufacture" filed 21 Apr. 2010 as assigned application number PCT/US 10/31869. This Application is also related to commonly-assigned, previously filed U.S. Provisional Application entitled "Method for Forming Structures in a Solar Cell," filed 21 Apr. 2009 and assigned application No. 61/171,187; and to commonly-assigned, co-filed International Patent Application entitled "Method for Forming Structures in a Solar Cell," filed 21 Apr. 2010 as assigned application number PCT/US10/31874. Each of these Applications is hereby incorporated herein by reference in its entirety. All aspects of the present invention may be used in combination with the disclosures of the above-noted Applications.

TECHNICAL FIELD

The present invention relates to solar cells. More particularly, the present invention relates to improved solar cell passivation layers, anti-reflective layers, back reflective layers and electrical contacts, and methods of their manufacture.

BACKGROUND OF THE INVENTION

In typical solar cells, the solar radiation is assumed to preferentially illuminate one surface of the solar cell, usually referred to as the front side. The opposite surface of the solar cell may also be illuminated, although typically not preferentially, and such a solar cell design is referred to as a bifacial cell. This opposite side is usually referred to as the back side. To achieve a high energy conversion efficiency of incident photons into electric energy, an efficient absorption of photons within the silicon substrate is important. This may be achieved by a low (parasitic) optical absorption of photons within all layers except the substrate itself For the sake of simplicity the impact of the wafer's geometrical shape (a surface texture like pyramids is usually formed on crystalline wafer surfaces or other modifications of a flat surface are applied) is not specifically addressed herein, because it is understood that the surfaces may be textured in any shape beneficial for improved solar cell efficiency.

In order to obtain a high electrical conversion efficiency of a solar cell, many parameters require optimization. This present invention in one aspect is a solar cell structure and a method of preparing the same which has the benefits of minimized recombination underneath metal contacts and functional films with desirable optical and electrical properties.

SUMMARY OF THE INVENTION

The shortcomings of the prior art are overcome and additional advantages are provided by the present invention which in one aspect relates to the change of a film's composition by, e.g., oxidation, nitridation and/or oxynitridation during which the film's optical properties and/or electrical properties are modified. A further aspect of this invention relates to the selective oxidation, nitridation and/or oxynitridation of a film to achieve electrical contact, with minimized recombination losses, to an underlying semiconductor substrate while simultaneously achieving desired optical and electrical properties. For the purposes of simplicity the processes of oxidation, nitridation and/or oxynitridation (and approximate equivalents) will be collectively referred to as 'oxidation' in the following descriptions.

In one aspect, the film is deposited on at least one side of a solar cell. Oxidation of this film is achieved by exposure to an appropriate environment (e.g. heat plus oxygen and/or water vapor). Certain films may be prone to oxidation when placed in an appropriate oxidizing environment. For example, doped or un-doped amorphous silicon or silicon carbide films readily oxidize at a rate dependent upon their exact morphology and the oxidizing environment conditions.

Selective oxidation of the film may be achieved by deposition of an overlaying barrier film or layer which blocks or prevents oxidation of the film beneath portions of the barrier. The width of the barrier film is typically much larger than the thickness of the film which is oxidized thus lateral oxidization beneath the barrier is small compared to the barrier width and hence relatively inconsequential. The un-oxidized film beneath the barrier may be, or may be later transformed into, a doped semiconducting layer forming a low resistive loss and low recombination electrical contact to the underlying semiconductor layers or wafer. In one embodiment the barrier film may be interconnected and forms a continuous contact grid. The barrier film may be a metal film and/or other thin film layers (e.g. dielectrics, semiconductors) deposited, at least in part, to block oxidation of the underlying thin film layer. The barrier film is not necessarily wholly or solely a metal film. The barrier film(s) may be sacrificial films which are removed after oxidization. The barrier film(s) or the underlying un-oxidized film may be subsequently plated to increase its electrical conductivity.

The solar cell structure and manufacturing method disclosed has benefits over prior art because by oxidation a thin film layer may be transformed into one with superior optical properties which, for example, may be better suited for a front side anti-reflective coating. Further, selective oxidation enables the formation small contact features with a minimal number of patterning steps and the formation of a selective emitter contacting structure with a minimal number of processing steps. Further, selective oxidation where the oxidized film has a lower electrically conductivity than the non-oxidized portion creates a structure more suitable for the selective plating of metal onto the contact areas.

In summary, a solar cell formation method, and resulting structure are disclosed, wherein a first film and a barrier film are formed over a surface of a doped semiconductor, wherein the optical and/or electrical properties of the first film are transformed in-situ such that a resulting transformed film is better suited to the efficient functioning of the solar cell; wherein portions of the barrier film partially cover the first film and substantially prevent transformation of first film areas beneath the portions of the barrier film.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter regarded as the invention is particularly pointed out and distinctly claimed in the claims at the conclusion of the specification. The foregoing and other objects, features, and advantages of the invention are apparent from the following detailed description taken in connection with the accompanying drawings in which:

DETAILED DESCRIPTION OF THE INVENTION

Figure 1A:
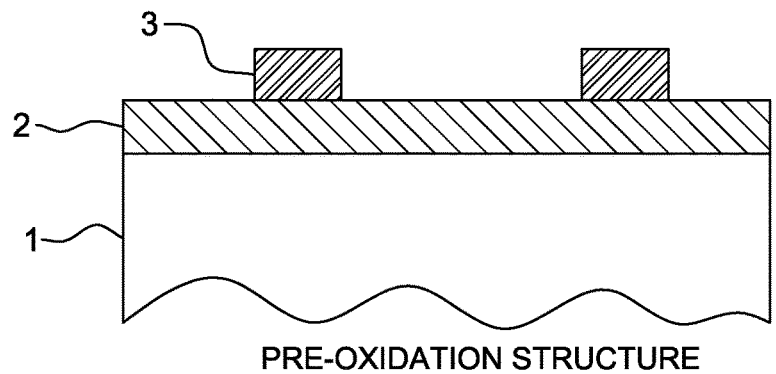
FIGS. 1a-c are partial cross-sectional views of an exemplary solar cell, during fabrication, in accordance with one aspect of the present invention.

The present invention can be applied to many solar cell structures. The following descriptions illustrate example embodiments of the invention (where like reference numerals are used to designate similar elements). The invention is not limited to these described embodiments.

EXAMPLE 1

Figure 1B:
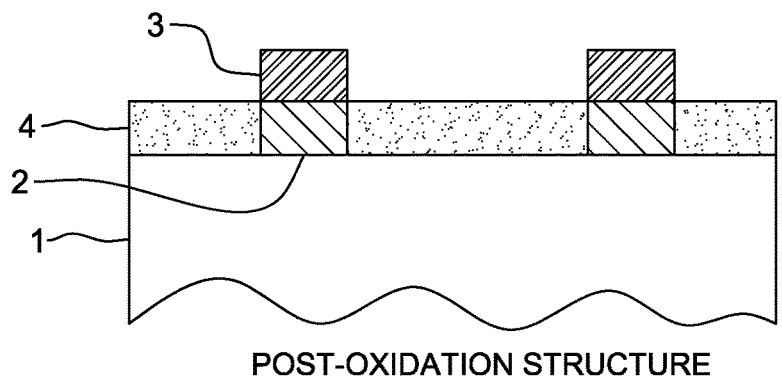
Figure 1C:
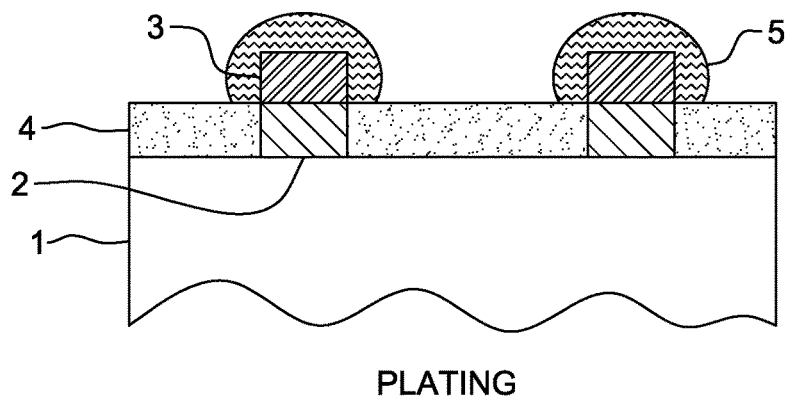

As shown in FIG. 1a a semiconducting thin film 2 is deposited over a doped semiconductor substrate 1. A patterned barrier film 3 is formed over the thin film. Barrier film 3 may be any film or combination of films (for example a metal and/or semiconducting films) which largely blocks oxidation and which may also provide electrical contact. In cases where the barrier film is metal it may be deposited by evaporation, printing, sputter deposition or any other relevant technique. This stack is placed in an oxidizing environment such that the structure shown in FIG. 1b results. Selective oxidation of the thin film 2 creates an oxidized thin film 4 only in those areas not covered by the barrier film 3. The thin film 2, barrier film 3 and oxidizing environment are all designed, at least in part, to achieve the selective oxidation structure as approximately illustrated in FIG. 1b. The resultant oxidized thin film 4 may have refractive index properties suitable to function, wholly or in part, as an anti-reflective layer and/or internal optical reflector. The barrier film 3 may be subsequently selectively plated with metal 5 as shown in FIG. 1c. Electrical contact to the substrate 1 from the solar cell contact grid (3 & 5) is via the un-oxidized portion of the thin film 2 which underlies the barrier film 3. As an alternate structure, barrier film 3 may be removed prior to plating or another metallization technique.

EXAMPLE 2

Figure 2A:
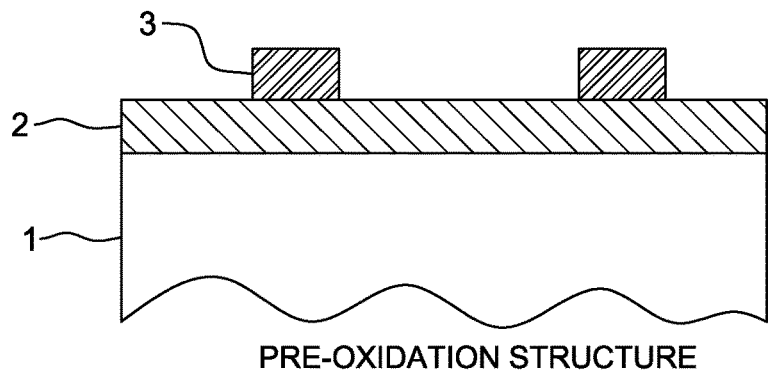
FIGS. 2a-c are partial cross-sectional views of an exemplary solar cell, during fabrication, in accordance with another aspect of the present invention.
Figure 2B:
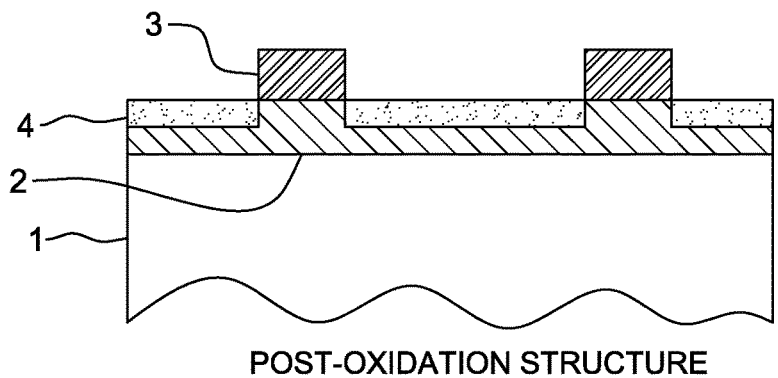
Figure 2C:
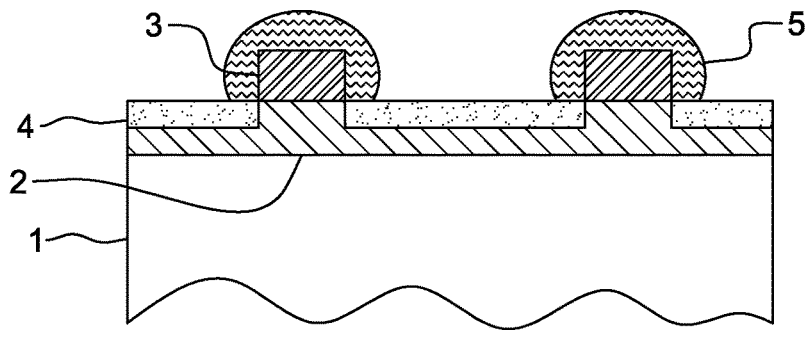

Another example of the invention is shown in FIGS. 2a-c. As shown in FIG. 2a a semiconducting thin film 2 is deposited over a doped semiconductor substrate 1. A patterned barrier film 3 is formed over the thin film 2. This stack is placed in an oxidizing environment such that the structure shown in FIG. 2b results. Selective oxidation of the thin film 2 creates an oxidized thin film 4 only in those areas not covered by the barrier film 3. The thin film 2, barrier film 3 and oxidizing environment are all designed, at least in part, to achieve the selective oxidation structure as illustrated in FIG. 2b. The resultant oxidized thin film 4 may have refractive index properties suitable to function, wholly or in part, as an anti-reflective layer and/or internal optical reflector. Partial oxidation of the thin film 2 thickness, in the exposed areas, is achieved by using oxidizing parameters, such as exposure time, that terminate oxidation prior to complete oxidation of the thin film 2. The barrier film(s) 3 may be subsequently selectively plated with metal 5 as shown in FIG. 2c. This structure has the advantage that desirable surface passivation and lateral conductivity properties of the thin film 2 can be retained while simultaneously achieving the desired optical and insulating properties in the overlying oxidized thin film 4. As an alternate structure barrier film (3) may be removed prior to plating or another metallization technique.

EXAMPLE 3

Figure 3A:
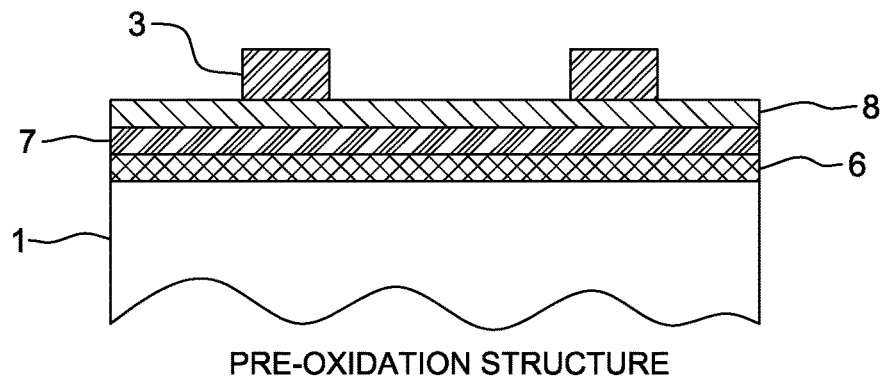
FIGS. 3a-c are partial cross-sectional views of an exemplary solar cell, during fabrication, in accordance with another aspect of the present invention.
Figure 3B:
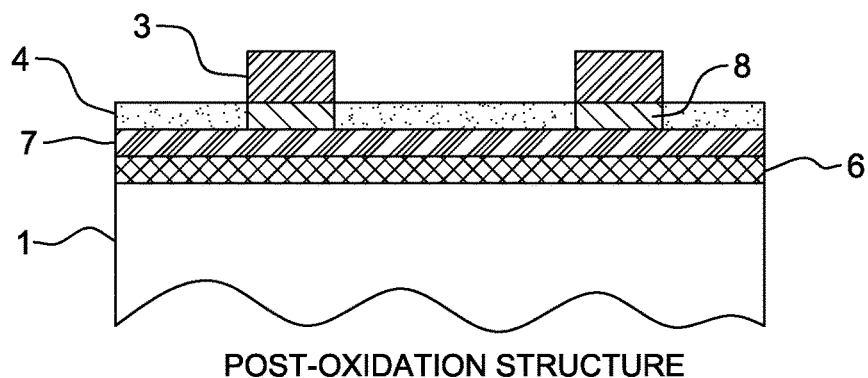
Figure 3C:
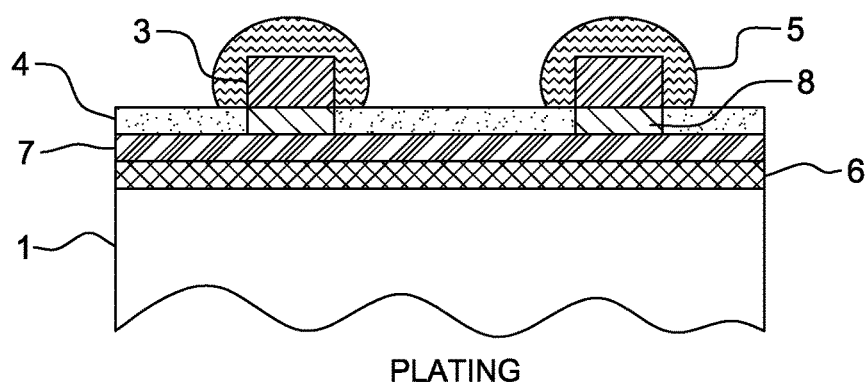

A further example of the invention is shown in FIGS. 3a-c. As shown in FIG. 3a a thin thermal tunnel oxide 6, a silicon rich doped silicon carbide layer 7 and a carbon rich doped silicon-carbide layer 8 are deposited over a doped semiconductor wafer 1. A patterned barrier film 3 is formed over the carbon rich doped silicon carbide 8. This stack is placed in an oxidizing environment such that the structure shown in FIG. 3 results. Selective oxidation of the carbon rich doped silicon-carbide layer 8 creates an oxidized thin film 4 only in those areas not covered by the barrier film 3. The thin film layers 7 & 8, barrier film 3 and the oxidizing environment are all designed, at least in part, to achieve the selective oxidation structure as illustrated in FIG. 3b. The resultant oxidized thin film 4 may have refractive index properties suitable to function, wholly or in part, as an anti-reflective layer and/or internal optical reflector. The silicon rich doped silicon-carbide layer 7 acts as an oxidation stop as it is less susceptible to oxidation than the overlying carbon rich doped silicon-carbide layer 8. The barrier film(s) 3 may be subsequently selectively plated with metal 5 as shown in FIG. 3c. This structure has the advantage that desirable surface passivation properties of layers 6 and 7 can be retained while simultaneously achieving the desired optical and insulating properties of the oxidized thin film 4. As an alternate structure, barrier film 3 may be removed prior to plating or another metallization technique.

EXAMPLE 4

Figure 4A:
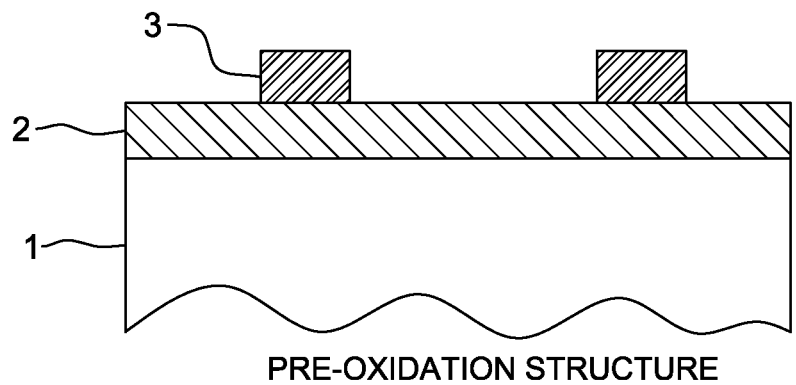
FIGS. 4a-d are partial cross-sectional views of an exemplary solar cell, during fabrication, in accordance with an aspect of the present invention.
Figure 4B:
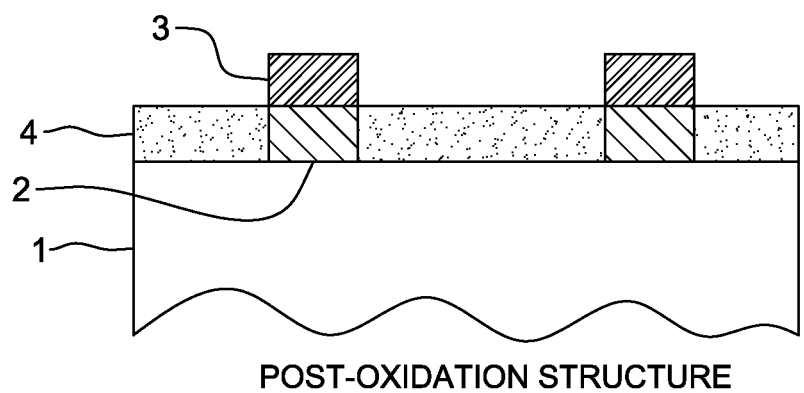
Figure 4C:
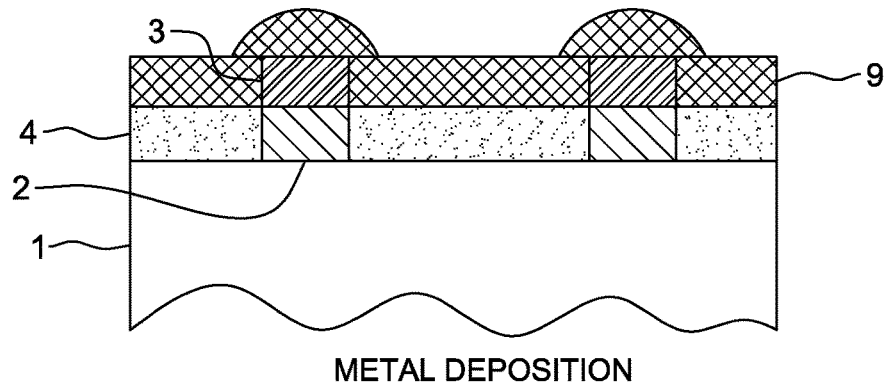
Figure 4D:
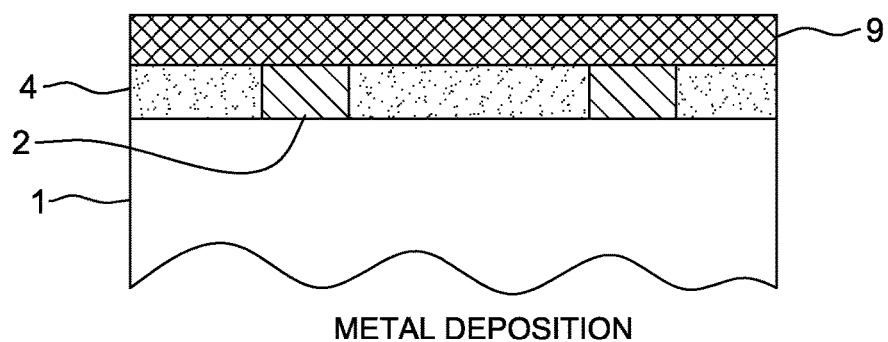

A further example of the invention is shown in FIGS. 4a-c. As shown in FIG. 4a, a semiconducting thin film 2 is deposited over a doped semiconductor substrate 1. A patterned barrier film 3 is formed over thin film 2. This stack is placed in an oxidizing environment such that the structure shown in FIG. 4b results. Selective oxidation of the thin film 2 creates an oxidized thin film 4 only in those areas not covered by the barrier film 3. The thin film 2, barrier film 3 and oxidizing environment are all designed, at least in part, to achieve the selective oxidation structure as approximately illustrated in FIG. 4b. The resultant oxidized thin film 4 may have refractive index properties suitable to function as an internal back optical reflector. As shown in FIG. 4c a metal film 9 may then be deposited over the barrier 3 and the oxidized film 4. Alternatively, as shown in FIG. 4d the barrier film 3 may be removed and a metal film 9 deposited over the oxidized film 4 and the un-oxidized thin film 2. These structures (4c and 4d) are suitable for implementation on the back side of a solar cell.

EXAMPLE 5

Figure 5A:
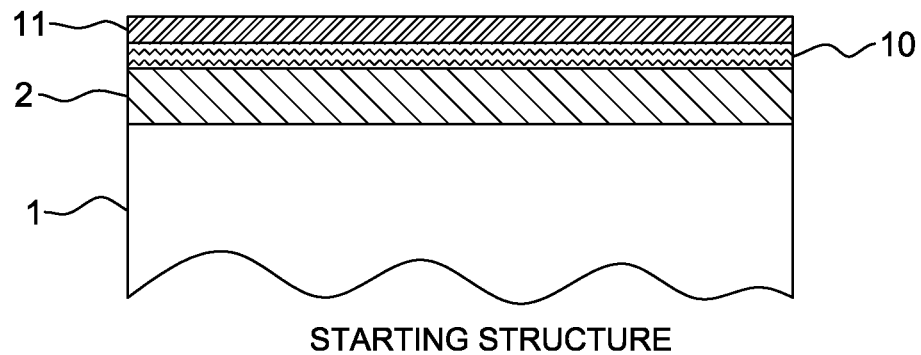
FIGS. 5a-d are partial cross-sectional views of an exemplary solar cell, during fabrication, in accordance with an aspect of the present invention.
Figure 5B:
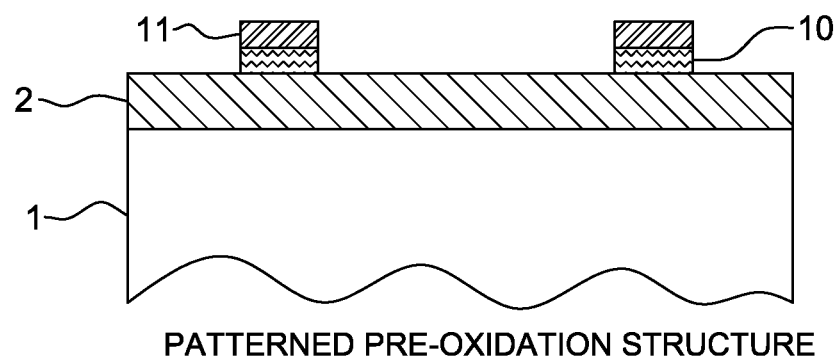
Figure 5C:
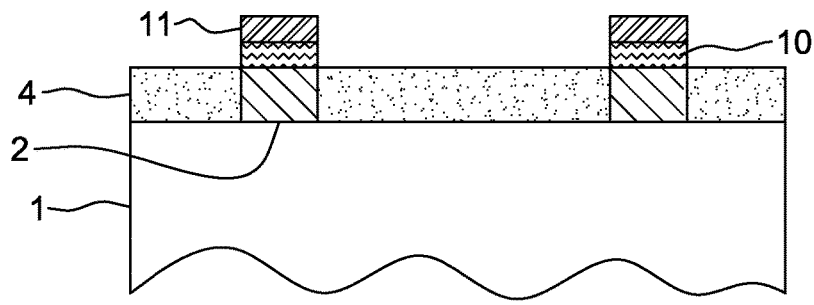
Figure 5D:
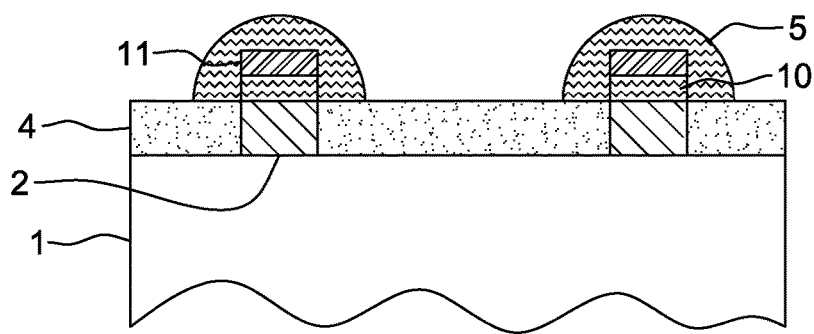

A further aspect of the invention is shown in FIGS. 5a-d. As shown in FIG. 5a a semiconducting thin film 2, interface film 10, and metal cap film 11 are deposited over a doped semiconductor substrate 1. The interface film 10 and metal cap film 11 are patterned to form a barrier film composed of these two layers as shown in FIG. 5b. This patterning may, for example, be performed by laser ablation. This stack is placed in an oxidizing environment such that the structure shown in FIG. 5c. Selective oxidation of the thin film 2 creates an oxidized thin film 4 only in those areas not covered by the multi-layer barrier film 10 & 11. The thin film 2, barrier films 10 & 11, and oxidizing environment are all designed, at least in part, to achieve the selective oxidation structure as approximately illustrated in FIG. 5c. The barrier films 10 & 11 may be subsequently thickened by selectively plated metal 5 as shown in FIG. 5d. This structure has the advantage that the interface film 11 may be selected such that it has desirable properties, for example optical absorption, which facilitate patterning via laser ablation to simultaneously remove interface film 10 and the overlying metal cap film 11. Further the interface film 11 may be selected to have desirable properties to allow for the formation of a low resistance contact between metal cap film 11 and un-oxidized thin film 2. An example of such an interface layer would be doped amorphous silicon.

In all five examples illustrated above, the thin film layers (2, 7, 8 and 10) may be doped semiconductors with a dopant type either identical to or opposite to that of the doped semiconductor wafer 1. Further, either prior to, during or after the oxidation process, illustrated above, the device may undergo thermal, laser or other treatment for the purposes of dopant activation, dopant diffusion, junction formation at the substrate 1 surface, crystalline phase change, low resistance contact formation, passivation and/or formation of a hetrojunction. The oxidized film 4 may be typically a dielectric such as silicon oxide, borosilicate glass, phosphosilicate glass, silicon oxynitride, silicon nitride, silicon oxycarbide, silicon carbon nitride or combinations of these.

Summarizing, with additional detail where appropriate, and with reference to the above Examples and Figures, the present invention in one aspect is a solar cell formation method, and resulting structure, having a film 2 and a barrier film 3 over a surface of a doped semiconductor 1 wherein the optical and/or electrical properties of film 2 are transformed in-situ such that a resulting transformed film 4 is better suited to the efficient functioning of the solar cell; and the portions of the barrier film 3 partially cover the film 2 and substantially prevent transformation of the film 2 beneath the portions of the barrier film.

The film 2 transformation process may be, e.g., oxidation, nitridation, or oxynitridation. Moreover, the film 2 transformation process may be performed by plasma assisted oxidation, nitridation or oxynitridation.

The film 2 may be a doped semiconductor layer whose dopant type has the same or opposite polarity to that of the doped semiconductor 1.

The substantially un-transformed film 2 beneath the barrier film 3 may form an electrical contact with the underlying doped semiconductor 1; and the barrier film 3 may form an electrical contact grid for the solar cell, the contact grid nominally being comprised of lines and bus-bars on the solar cell front side, lines and bus-bars on the back side of a bifacial solar cell, or discrete contact points on the back side of a mono-facial solar cell. The contacts may be contact lines less than about 200 um width, or contact points of less than about 200 um diameter; or contact lines of less than about 50 um width or contact points are less than about 50 um diameter.

The film 2 and transformed film 4 may have a thickness approximately in the range of 20 nm to 180 nm, and more optimally in the range of 50 nm to 100 nm The transformed film 4 may form an anti-reflective coating (ARC) on the solar cell; or a back internal optical reflector on the solar cell.

The process may be used on two sides of the solar cell such that a bi-facial solar cell is formed.

The barrier film 3 may be a metal film, a doped semiconductor film, or a metal film overlying a doped semiconductor film. The doped semiconductor film may be doped amorphous silicon, doped amorphous silicon carbide, doped polycrystalline silicon or doped polycrystalline silicon carbide. The barrier film(s) may deposited on film 2 and patterned by a laser. The barrier film 3 may also be a sacrificial film which is subsequently removed. The barrier film 3 or un-transformed film 2 may be subsequently plated with metal.

Film 2 may be doped amorphous silicon, doped amorphous silicon carbide, doped polycrystalline silicon or doped polycrystalline silicon carbide.

Transformed film 4 may be primarily silicon oxide, borosilicate glass, phosphosilicate glass, silicon nitride, silicon oxynitride, silicon oxycarbide or silicon carbon nitride.

Film 2 may be a multilayer film of doped amorphous silicon carbide or doped polycrystalline silicon carbide whose compositional stoichiometry (x) ($Si_{1-x}C_x$) varies between layers. The composition stoichiometry (x) of the layers may vary between approximately 0 and 0.8.

Film 2 may be a multilayer film of doped amorphous silicon carbide or doped polycrystalline silicon carbide whose as-deposited density varies between layers. The varying compositional stoichiometry and density of film 2 enables partial transformation of film 2.

Transformation of film 2 may be controllably terminated such that the transformed film 4 does not extend all the way to the surface of the doped semiconductor 1.

The surface of the doped semiconductor may have an electrically passivating surface interface layer, beneath film 2, which is largely unaffected by the transformation process. The electrically passivating surface interface layer may have a thickness of less than 20 nm. The electrically passivating surface interface layer may be, e.g., silicon nitride, intrinsic amorphous silicon, silicon oxide, intrinsic polycrystalline silicon, aluminum oxide, doped amorphous silicon carbide, doped polycrystalline silicon carbide, intrinsic polycrystalline silicon carbide, intrinsic amorphous silicon carbide, aluminum nitride, phosphorus nitride, titanium nitride, titanium dioxide, doped amorphous silicon and/or doped polycrystalline silicon.

The oxidation process may be performed in an oxygen and/or water vapor containing environment at a temperature higher than 600° C. The nitridation process may be performed in an ammonia and/or nitrogen containing environment at a temperature higher than 750° C. The oxynitridation process is performed in an ammonia and/or nitrogen and oxygen and/or water vapor containing environment at a temperature higher than 600° C.

The barrier film 3 or un-transformed film 2 and the transformed film 4 may be covered with a thin film metal layer, the thin film metal layer being formed by one or more techniques including sputter deposition, screen print, evaporation, plating, spray coating or like. The thin film metal layer may form the back contact metal of the solar cell.

The above-incorporated Application entitled "Method for Forming Structures in a Solar Cell" describes one possible technique for creating the partial barrier film coverage applicable to all examples above, and specifically Example 5.

The present invention is not restricted to the front-side of a solar cell. It may similarly be implemented on the back side of a solar cell or used in a bi-facial cell design.

The present invention is not restricted to implementation on a semiconductor substrate 1. It may be implemented on any doped semiconducting layer.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A method of forming a solar cell comprising:
providing a multilayer semiconductor film above a semiconductor surface of the solar cell, the multilayer semiconductor film comprising multiple multi-element semiconductor layers having a varying compositional property between at least two multi-element semiconductor layers of the multiple multi-element semiconductor layers;
providing at least one barrier film above the multilayer semiconductor film, the at least one barrier film being patterned to expose a first portion of the multilayer semiconductor film and to protect a second portion of the multilayer multi-element semiconductor film;
oxidizing one multi-element semiconductor layer of the at least two multi-element semiconductor layers within the first portion of the multilayer semiconductor film without oxidizing another multi-element semiconductor layer of the at least two multi-element semiconductor layers within the first portion of the multilayer film, wherein the varying compositional property of the at least two multi-element semiconductor layers allows oxidizing of the one multi-element semiconductor layer and inhibits oxidizing of the other multi-element semiconductor layer, the other multi-element semiconductor layer acting as an oxidization stop, the oxidizing modifying a refractive index of the one multi-element semiconductor layer within the first portion of the multilayer semiconductor film and reducing electrical conductivity of the one multi-element semiconductor layer within the first portion of the multilayer semiconductor film; and
wherein the at least one barrier film prevents oxidization of at least a part of the second portion of the multilayer semiconductor film, the non-oxidized part of the second portion of the multilayer multi-element semiconductor film facilitating electrical connection through the multiple multi-element semiconductor layers of the multilayer semiconductor film to the semiconductor surface of the solar cell.

2. The method of claim 1, wherein the varying compositional property between the at least two multi-element semiconductor layers that enables the other multi-element semiconductor layer to act as the oxidization stop, comprises elements in the other multi-element semiconductor layer that are less susceptible to oxidation than elements of the one multi-element semiconductor layer.

3. The method of claim 1, wherein the oxidizing comprises plasma assisted oxidation or oxynitridation of the first portion of the multilayer semiconductor film.

4. The method of claim 1, wherein the at least one barrier film comprises an electrical contact grid of the solar cell, the contact grid comprising lines and bus-bars over a front side of the solar cell, lines and bus-bars over a back side of the solar cell, or discrete contact points over the back side of the solar cell.

5. The method of claim 1, wherein the oxidized one multi-element semiconductor layer within the first portion of the multilayer semiconductor film provides an anti-reflective coating (ARC) of the solar cell.

6. The method of claim 1, wherein the oxidized one multi-element semiconductor layer within the first portion of the multilayer semiconductor film provides a back internal optical reflector of the solar cell.

7. The method of claim 1, wherein the at least one barrier film includes a first barrier film comprising a doped semiconductor film layer, and the method further comprises providing a second barrier film comprising a metal film overlying the doped semiconductor film layer.

8. The method of claim 7, wherein the doped semiconductor film layer comprises one or more of doped amorphous silicon, doped amorphous silicon carbide, doped polycrystalline silicon, or doped polycrystalline silicon carbide.

9. The method of claim 1, wherein the at least one barrier film comprises a sacrificial film which is subsequently removed from over the second portion of the multilayer semiconductor film.

10. The method of claim 1, wherein the multilayer semiconductor film comprises one or more of doped amorphous silicon, doped amorphous silicon carbide, doped polycrystalline silicon or doped polycrystalline silicon carbide.

11. The method of claim 10, wherein the oxidized one multi-element semiconductor layer within the first portion of the multilayer semiconductor film comprises one or more of silicon oxide, borosilicate glass, phosphosilicate glass, silicon nitride, silicon oxynitride, silicon oxycarbide or silicon carbon nitride.

12. The method of claim 1, wherein the multiple multi-element layers of the multilayer semiconductor film comprise multiple layers of doped amorphous silicon carbide or doped polycrystalline silicon carbide, and wherein the varying compositional property comprises a compositional stoichiometry $(x)(Si_{1-x}C_x)$, the compositional stoichiometry varying between the at least two multi-element semiconductor layers.

13. The method of claim 12, wherein the compositional stoichiometry of the other multi-element semiconductor layer of the at least two multi-element semiconductor layers inhibits oxidizing of the other multi-element semiconductor layer of the at least two multi-element semiconductor layers of the semiconductor film to enable only a partial oxidizing of the first portion of the semiconductor film.

14. The method of claim 1, wherein the multiple multi-element semiconductor layers of the multilayer semiconductor film comprise multiple layers of doped amorphous silicon carbide or doped polycrystalline silicon carbide, and wherein the compositional property comprises an as-deposited density, the as-deposited density varying between the at least two multi-element semiconductor layers.

15. The method of claim 14, wherein the as-deposited density of the other multi-element semiconductor layer of the at least two multi-element semiconductor layers inhibits oxidation of the other multi-element semiconductor layer of the at least two multi-element semiconductor layers of the multilayer semiconductor film to enable only a partial oxidation of the first portion of the semiconductor film.

16. The method of claim 1, wherein the oxidizing is inhibited by the other multilayer semiconductor film of the at least two multi-element semiconductor layers such that the oxidized portion of the semiconductor film does not extend through the entire first portion of the semiconductor film and does not contact the semiconductor surface.

17. The method of claim 1, further comprising providing an electrically passivating surface interface layer above the semiconductor surface and beneath the multilayer semiconductor film, wherein at least a part of the electrically passivating surface interface layer remains unaffected by the oxidizing.

18. The method of claim 17, wherein the electrically passivating surface interface layer has a thickness of less than 20 nm.

19. The method of claim 17, wherein the electrically passivating surface interface layer comprises one or more of silicon nitride, intrinsic amorphous silicon, silicon oxide, intrinsic polycrystalline silicon, aluminum oxide, doped amorphous silicon carbide, doped polycrystalline silicon carbide, intrinsic polycrystalline silicon carbide, intrinsic amorphous silicon carbide, aluminum nitride, phosphorus nitride, titanium nitride, titanium dioxide, doped amorphous silicon or doped polycrystalline silicon.

20. The method of claim 1, wherein the oxidation being performed in an oxygen and/or water vapor containing environment at a temperature higher than 600° C.

21. The method of claim 1, wherein the oxidizing comprises performing an oxynitridation, the oxynitridation being performed in an ammonia and/or nitrogen and oxygen and/or water vapor containing environment at a temperature higher than 600° C.

22. A solar cell formed according to the method of claim 1.

* * * * *